United States Patent [19]

Schairer

[11] Patent Number: 4,975,814
[45] Date of Patent: Dec. 4, 1990

[54] WIDE-AREA LAMP

[75] Inventor: Werner Schairer, Weinsberg, Fed. Rep. of Germany

[73] Assignee: TELEFUNKEN electronic GmbH, Heilbronn, Fed. Rep. of Germany

[21] Appl. No.: 390,817

[22] Filed: Aug. 8, 1989

[30] Foreign Application Priority Data

Aug. 10, 1988 [DE] Fed. Rep. of Germany ....... 3827083

[51] Int. Cl.$^5$ ............................................. F21V 11/00
[52] U.S. Cl. ................................... 362/240; 362/241; 362/800
[58] Field of Search ................... 362/61, 97, 227, 235, 362/249, 240, 238, 241, 245, 800

[56] References Cited

U.S. PATENT DOCUMENTS

| 4,271,408 | 6/1981 | Teshima et al. | 362/800 X |
| 4,439,818 | 3/1984 | Scheib | 362/800 X |
| 4,630,180 | 12/1986 | Muraki et al. | 362/223 |
| 4,733,335 | 3/1988 | Serizawa et al. | 362/80 |

FOREIGN PATENT DOCUMENTS

| 0253244 | 1/1988 | European Pat. Off. . |
| 2732780 | 2/1979 | Fed. Rep. of Germany . |
| 2814877 | 10/1979 | Fed. Rep. of Germany . |
| 2934140 | 3/1981 | Fed. Rep. of Germany . |
| 8313500 | 5/1983 | Fed. Rep. of Germany . |
| 3148843 | 6/1983 | Fed. Rep. of Germany . |
| 3230975 | 2/1984 | Fed. Rep. of Germany . |
| 3438154 | 4/1986 | Fed. Rep. of Germany . |
| 3315785 | 9/1988 | Fed. Rep. of Germany . |
| WO8400799 | 3/1984 | PCT Int'l Appl. . |
| 2114368 | 8/1983 | United Kingdom . |
| 2139340 | 11/1984 | United Kingdom ................ 362/800 |

OTHER PUBLICATIONS

"Höchstleistungs–chstleistungs-LEDs für Rotsignale", Horst Schilling, *Elektronik Industrie* 6,-1987, pp. 43–44.
"Argus–Dioden Beleuchten Flächen", Peter Kristufek, *Elektronik,* 12, Jun. 12, 1987, pp. 124–126.

*Primary Examiner*—Stephen F. Husar
*Attorney, Agent, or Firm*—Spencer & Frank

[57] ABSTRACT

The invention relates to a wide-area lamp and consists of a transparent mounting plate with conducting path structure on which a large number of luminescent semiconductor elements connected to the conducting path structure are mounted in a wide-area spread. Each semiconductor element is surrounded by a reflector, with these reflectors being arranged on the mounting plate and reflecting through the mounting plate the light emitted by the semiconductor elements.

15 Claims, 2 Drawing Sheets

WIDE-AREA LAMP

BACKGROUND OF THE INVENTION

The invention relates to a wide-area lamp. In wide-area lamps, for example automobile lights, bulbs are used as a rule, mostly together with a reflector. However, bulbs have only a limted life, and in addition their dimensions entail a relatively deep design.

By contrast, luminescent diodes have the advantage that they have a longer life and therefore operate more dependably, that they have a better electro-optical efficiency and therefore a lower energy requirement, and that shallower construction depths are possible thanks to their flat structure. Luminescent diodes are therefore preferably used where replacement of individual bulbs is awkward and expensive, and where high demands are placed in dependability, safety and long-term stability of the lamp.

Lamps for red signals with high-power LEDs are known from the periodical "elektronik industrie" 6, 1987, pages 43–44. These lamps have electrical connections in conventional vertical-strip design, i.e. the direction of the LED connections is vertical to the large area of the original semiconductor disc from which the LED element was cut out. These LEDs can be connected in series using a PCB.

However, these lamps have the drawback that the luminous efficiency is not optimum, that the connections must be made as vertical strips in a fairly expensive manner, and that a particularly flat design is not possible.

SUMMARY OF THE INVENTION

The object of the invention is to avoid these drawbacks and to provide a lamp that can be made at low cost, with high efficiency, and in a flat design. This is achieved in accordance with the invention by providing a transparent mounting plate with conducting path structure on which a large number of luminescent semiconductor elements connected to the conducting path structure are mounted in a wide-area spread, and by surrounding each semiconductor element with a reflector that reflects through the mounting plate the light emitted by the semiconductor element and hitting the reflector.

The reflectors are equally distributed in a number adequate to requirements over the mounting plate. In the event that a high radiant power is required, the reflectors are closely adjacent to one another, so that the surface of the mounting plate is optimally exploited.

Further advantageous embodiments of the invention are described in the sub-claims.

By mounting and contacting the luminescent semiconductor elements on a plate, no vertical strips are required for the connections, so that an inexpensive manufacturing process with simultaneous reduction of the construction depth is possible. The high luminous flux exploitation, the effective light bunching, and the simple design of the reflectors result in a high lamp efficiency together with a relatively low evergy requirement.

BRIEF DESCRIPTION OF THE DRAWINGS

The lamp in accordance with the invention and its embodiments will now be described in greater detail on the basis of FIGS. 1–4, shown in the drawings, in which.

DESCRIPTION OF THE PREFERRED EMBODIMENTS

Figure 1:
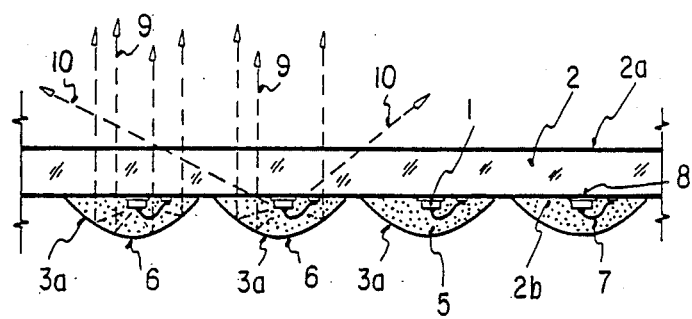
FIG. 1 shows a section through the wide-area lamp, in which the reflectors designed in solid form are located underneath the transparent mounting plate.
Figure 2:
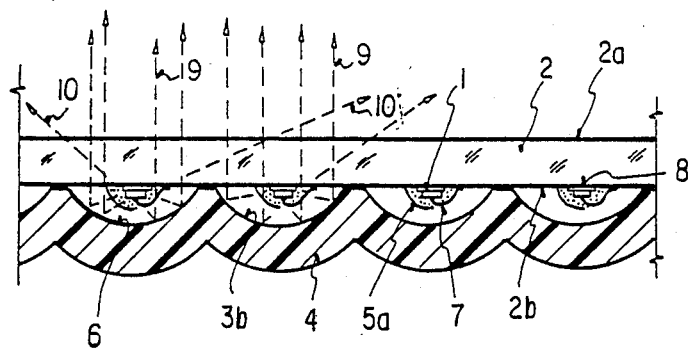
FIG. 2 shows a section through the wide-area lamp in which the reflectors designed in hollow form are located underneath the transparent mounting plate.

The manufacturing processes and the mode of operation of the wide-area lamp in accordance with the invention is explained on the basis of the embodiment in FIG. 1. On the transparent mounting plate, 2 for example a glass plate, the known photolithographic method is used to deposit the conducting paths 12, which serve in accordance with FIG. 4 to contact and interconnect the semiconductor elements 1. The semiconductor elements 1, having for example an extent of $250\mu \times 250\mu$, are affixed or soldered onto the mounting plate 2, preferably by automatic fitting connected using bonding wires 7 to the conducting paths 12. To make the reflectors 3a, a casting mold, that can have for example the same form as the shaped element 4 in FIG. 2, is cast with a plastic sealing compound, for example silicone resin, epoxy resin, polyimide or polyphenylene sulfide. The transparent mounting plate 2 with conducting path structure 12 and the semiconductor elements 1 mounted on it is immersed in the sealing compound such that each semiconductor element 1 is located at the focal point of the preferably parabolic plastic element 5.

After setting of the sealing compound and demolding by removal of the casting mold, the outer surface 6 of the plastic element can be coated with a highly reflective material, e.g. aluminum or silver, to form the reflectors 3a. The parabolic form of the reflector bunches the entire reflected light beams 9 parallel to achieve the maximum possible luminous efficiency. To ensure a good transmission of the light beams 9 without reflection or refraction on the reflector/mounting plate border area, the plastic element 5 should have approximately the same refractive index as the transparent mounting plate 2. For example, a glass plate has a refractive index of approx. 1.5 . If the casting mold is required, for example for stability or for protection of the reflecting surfaces, it is not removed after hardening of the sealing compound. The inside of the mold is then formed to give high reflection, for which it can be coated with a high-reflection material, for example, prior to insertion of the sealing compound. Direct light beams 10 are, unlike reflected light beams 9, not bunched parallel but isotropically distributed, so that they contribute only to a minor extent to an increase in the luminous intensity. For this reason, the contact area 8 on the rear of the semiconductor element is designed highly reflective if possible. This means that the light beams 10 emitted in the direction of the mounting plate are largely reflected and contribute to the light beams 9 emitted directly in the direction of the reflector and reflected there, and thereby contribute to the overall emission and achieve a high overall efficiency.

In a further embodiment in accordance with FIG. 2, the reflectors 3b are designed, by virtue of a shaped element 4, in hollow form. Mounting and contacting of the semiconductor element 1 on the mounting plate 2 is implemented in the same manner as described for the embodiment in FIG. 1. In order to improve the light beam output from the luminescent semi-conductor element 1, a synthetic resin 5a having a refractive index of approx. 1.5 is dripped onto the semiconductors. The mounting plate 2 is then connected without sealing to the shaped element 4. The inside 6 of the shaped element is highly reflective and can, for example, be coated with a high-reflection material before being connected to the mounting plate. Here too, only the light beams 9 reflected by the reflector 3b are predominantly output.

In a further embodiment, a lamp in accordance with FIG. 1 or 2 is first formed in solid or hollow form, and further reflectors 11, which can be manufactured using separate casting molds or injection molds, are deposited on the upper side 2a of the mounting plate, for example using an optical adhesive. These additional reflectors 11 shown in FIG. 3 in solid form, have the shape of a truncated parabola and are affixed to the upper side 2a of the mounting plate in such a way that the reflectors 3a, 11 above and below the mounting plate 2 together result in a paraboloic profile.

In this embodiment, both a major proportion of the light beams 10 emitted upwards and the light beams 9 emitted downwards and reflected are bunched so that the luminous intensity and the degree of light use are increased.

Figure 3:
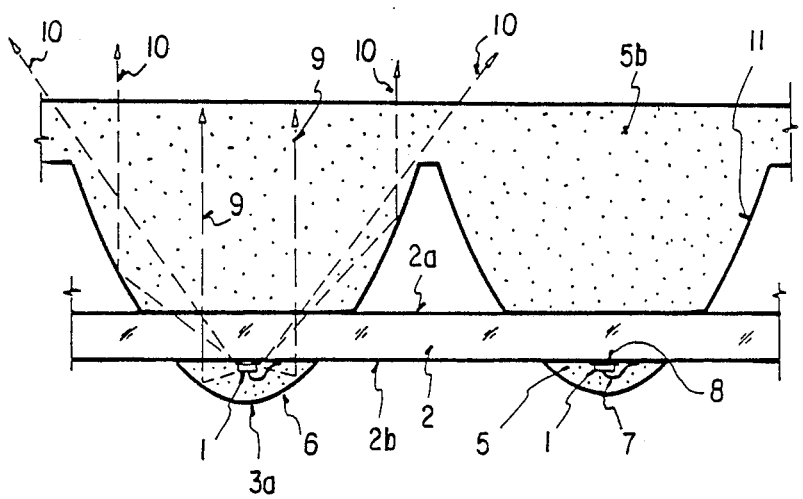
FIG. 3 shows a section through the wide-area lamp in which the reflectors designed in solid form are located both underneath and above the transparent mounting plate.

In FIG. 3, the plastic elements 5b of the reflectors 11 above the mounting plate are preferably made of the same material as the plastic elements 5 of the reflectors 3a below the mounting plate. The upper reflectors 11 therefore have the same refractive index as the transparent mounting plate and therefore permit good transmission of the light beams without additional reflection or refraction on the mounting plate/reflector border area.

Figure 4:
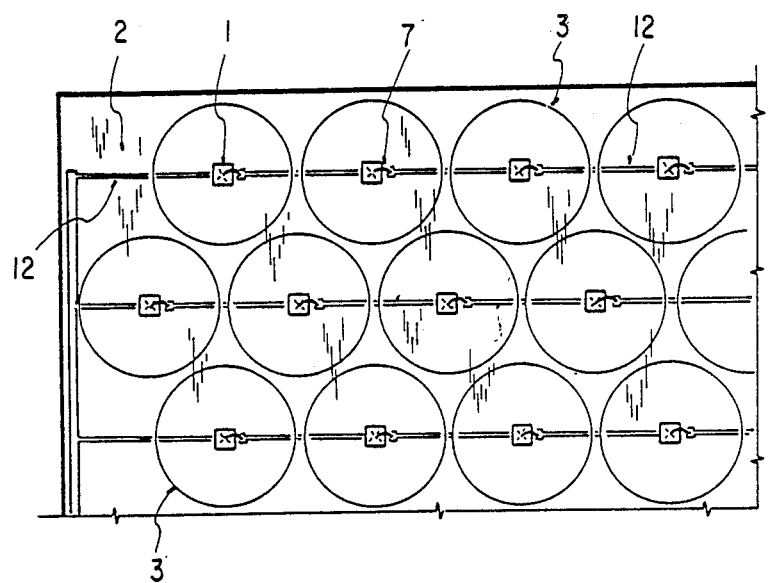
FIG. 4 shows in plan view the mounting plate with conducting path structure and semiconductor elements.

FIG. 4 shows contacting and wiring of semiconductor elements 1 on the mounting plate 2. Depending on the requirements and on the specification, several semiconductor elements 1 can be attached over the whole available surface of the mounting plate and be connected one behind the otther to increase the operating voltage and/or connected in parallel to achieve the required luminous intensity. This interconnection can be varied here to suit the given layout of the conducting path structure 12.

The semiconductor elements 1 are preferably arranged on the mounting plate 2 in such a way that for certain requirements a maximum luminous intensity is achieved. For this purpose it is possible to place the reflectors 3 closely adjacent, for example, and so optimally exploit the space available on the mounting plate.

The number of luminescent diodes used, their connection, and the wavelength of the emitted light beams can be preset exactly to comply with specific requirements and shifted without problem into the infra-red range, e.g. by using GaAs diodes.

The luminescent diodes used typically have a forward voltage of 2 V and a permissible current intensity of 50 mA, so that approx. 5 to 6 diodes must be connected one behind the other for an operating voltage of 12 V.

The luminous flux of a single luminescent diode is typically 1–4 lm, the luminous intensity approx. 1–3 cd; for an automobile stop light, for example, the luminous intensity must be between 40 and 100 cd.

In order to obtain red light-emitting lamps, for example, GaAlAs hetero-structure diodes can be used, the maximum emission of which is 660 nm.

The lamp in accordance with the invention can be used in many applications; for example, it might be used as automobile light, signal light or side light, or in traffic lights.

What is Claimed is:

1. A wide-area lamp, wherein a transparent mounting plate with conducting path structure is provided, on which a large number of luminescent semiconductor elements connected to said conducting path structure are mounted in a wide-area spread, and wherein each semiconductor element is surrounded by a reflector that reflects through said mounting plate the light emitted by said semiconductor element and hitting said reflector.

2. A wide-area lamp according to claim 1, wherein the reflectors are evenly distributed over the mounting plate.

3. A wide-area lamp according to claim 1, wherein the reflectors are placed closely adjacent in order to optimally exploit the space available on the mounting plate.

4. A wide-area lamp according to claim 1, wherein each semiconductor element is embedded in a plastic element on the underside of the transparent mounting plate.

5. A wide-area lamp according to claim 4, wherein the outer faces of the plastic elements are designed high-reflective.

6. a wide-area lamp according to claim 4, wherein the plastic elements are surrounded by a casting mold whose inside forms the reflectors.

7. A wide-area lamp according to claim 4, wherein the refractive index of the plastic element is approximately that of the transparent mounting plate.

8. A wide-area lamp according to claim 1, wherein the semiconductor elements are arranged on the underside of the transparent mounting plate and are surrounded by a shaped element whose inside forms the reflectors and wherein there is air between the plastic element and said shaped element.

9. A wide-area lamp according to claim 1, wherein the reflectors designed in parabolic form with a semiconductor element arranged in each case in the focal point of a reflector.

10. A wide-area lamp according to claim 1, wherein additional reflectors are arranged on the upper side of the transparent mounting plate that have the shape of a truncated parabola and together with the reflectors on the underside of the mounting plate have the structure of a paraboloid.

11. A wide-area lamp according to claim 10, wherein the additional reflectors on the upper side of the transparent mounting plate are designed as plastic elements whose outer surfaces are highly reflective.

12. A wide-area lamp according to claim 11, wherein the refractive index of the plastic element is approximately that of the transparent mounting plate.

13. A wide-area lamp according to claim 10, wherein the additional reflectors on the upper side of the transparent mounting plate are designed hollow by means of a shaped element, the inside of the hollow form being highly reflective.

14. A wide-area lamp according to claim 1, wherein the semiconductor elements are connected in parallel and/or in series on the transparent mounting plate by means of the conducting path structure.

15. The use of a wide-area lamp according to claim 1 for automobile lights, signal lights, side lights or traffic lights.

* * * * *